United States Patent [19]

Eskandari

[11] Patent Number: 5,515,530
[45] Date of Patent: May 7, 1996

[54] METHOD AND APPARATUS FOR ASYNCHRONOUS, BI-DIRECTIONAL COMMUNICATION BETWEEN FIRST AND SECOND LOGIC ELEMENTS HAVING A FIXED PRIORITY ARBITRATOR

[75] Inventor: Nick G. Eskandari, Chandler, Ariz.

[73] Assignee: Intel Corporation, Santa Clara, Calif.

[21] Appl. No.: 172,436

[22] Filed: Dec. 22, 1993

[51] Int. Cl.$^6$ .................................................... G06F 11/00
[52] U.S. Cl. ..................... 395/180; 371/22.5; 364/267.8; 364/269.4
[58] Field of Search ........................... 395/570; 371/22.3, 371/22.5; 364/183, 264.1, 267.8, 269.4

[56] References Cited

U.S. PATENT DOCUMENTS 5,210,705  5/1993  Chauvel et al. ..................... 364/572

*Primary Examiner*—Vincent P. Canney
*Attorney, Agent, or Firm*—Blakely, Sokoloff, Taylor & Zafman

[57] ABSTRACT

The present invention provides a method and apparatus for enabling asynchronous, bi-directional communication between the CPU of a CPU-based integrated circuit and an external system having digital logic for effecting transitions between operating modes of the integrated circuit. The apparatus is utilized to inform the CPU of an interrupt request transmitted from the external system and to subsequently inform the external system of an interrupt acknowledgment transmitted from the CPU. This is accomplished by providing the CPU with a first associated register and the external system with a second associated register in addition to selector means coupled in parallel to the first register and the second register. The selector means has as a first input a first value forming an interrupt request stored in the first register and as a second input a second value forming an interrupt acknowledgment stored in the second register. The selector means further has as input a write signal from the CPU and a synchronized update signal from the external system for selecting as output from the selector means one of the first value and the second value in response to assertion of the synchronized update signal and assertion the write signal, respectively. The second register also has as input the output of the selector means for transmitting one of the first and second values to the second register which is further coupled to the first register for subsequently transmitting the selected value to the first register upon assertion of a capture signal from the external system to the first register.

24 Claims, 5 Drawing Sheets

METHOD AND APPARATUS FOR ASYNCHRONOUS, BI-DIRECTIONAL COMMUNICATION BETWEEN FIRST AND SECOND LOGIC ELEMENTS HAVING A FIXED PRIORITY ARBITRATOR

BACKGROUND OF THE INVENTION

1. Field of the Invention

The present invention relates to the field of data processing, and more specifically to bi-directional communication registers which enable asynchronous communication between two separate logic elements.

2. Prior Art

An in-circuit emulator (ICE) is a hardware/software mechanism implemented within a micro-processor (or CPU) based integrated circuit (IC) for imitating the behavior of the IC using programming techniques and special machine features. The ICE operates in two modes of execution, an emulation mode and an interrogation mode. In emulation mode, the ICE performs real-time event evaluation during normal execution of the user code. In interrogation mode, however, normal system functions of the IC are interrupted and the ICE communicates with an external emulator system having digital logic means to interrogate the IC for register values and to execute debugging micro-code (known as a "monitor") written for testing of the IC.

To exit from emulation mode into interrogation mode, break logic is implemented to interrupt the processor's current stream of instructions. Co-pending patent application Ser. No. 07/985,563 describes an ICE apparatus for controlling a number of on-chip break mechanisms externally using a dedicated input pin. The ICE includes an instruction pointer counter and break logic connected to the instruction pointer having an arm input and being capable of matching the instruction pointer to an instruction execution address. Once a cluster is armed by a sequencer, a match from the instruction pointer matches results in a break and the emulation mode stops immediately so as to place the IC into the interrogation mode.

In order to begin interrogation of the IC, the external emulator system needs to be notified that the CPU has accepted an interrupt issued by the break logic and has ceased execution of the user code. However, the CPU and the external system run on different clocks such that their timing operations are asynchronous with respect to each other. Therefore, it would be desirable to provide an asynchronous, bi-directional communication means whereby an external system can request an interrupt to the CPU and the CPU can immediately acknowledge that the interrupt has been accepted so as to begin a non-CPU operation such as interrogation of the IC by the external system.

It is therefore an object of the present invention to provide a bi-directional communications register in a CPU-based IC that can be polled by the CPU at the same time an external system is asynchronously writing an interrupt request to the register.

It is another object of the present invention to provide a bi-directional communications register in a CPU-based IC which stores an interrupt request received from an external system and allows the CPU to asynchronously overwrite the request with an interrupt acknowledgment upon ceasing CPU operations to memory.

It is a further object of the present invention to provide the above-described bi-directional communications register in a CPU-based IC having an in circuit emulator coupled to an external emulator system for interrogating and testing the IC, the register enabling asynchronous transmission of interrupt signals between the CPU and the external system for causing transitions between emulation and interrogation modes of the IC.

It is yet a further object of the present invention to implement the above-described register in a CPU-based IC in a manner that enables serial transmission of data between the IC and an external system so as to minimize the number of IC connection pins required to effect transitions between operating modes of the IC.

SUMMARY OF THE INVENTION

To accomplish these and other objectives, the present invention provides a method and apparatus for enabling asynchronous, bi-directional communication between the CPU of a CPU-based IC and an external system having digital logic for effecting transitions between operating modes of the IC. The CPU-based IC preferably comprises an ICE coupled to an external emulator system for interrogating register values of the IC and executing debugging micro-code stored in embedded memory when the IC is placed in an interrogation mode.

To enter the interrogation mode, a RISM ACTION command comprising a series of data bits forming a RISM data field, a RISM address field, and a RISM command field including a FGO bit and a break bit is serially input to a RISM ACTION register disposed within a memory interface unit of the IC. The RISM ACTION register includes a RISM CMD chain coupled in parallel to a corresponding CORE CMD register, a RISM ADDR chain coupled in parallel to a corresponding CORE ADDR register and a RISM DATA chain coupled in parallel to a corresponding CORE DATA register. To effect the transition into interrogation mode, the break bit of the RISM CMD register chain must be set in order to cause an interrupt to be issued to the CPU. Upon assertion of an UPDR signal from the external system to a RISM ACTION register, the bits in the RISM ACTION register are written in parallel to the corresponding CORE registers.

The CPU then detects the set break bit upon update of the RISM ACTION register and issues an NMIE to the interrupt unit. The interrupt unit transfers processor control from the user's code to RISM micro-code stored at the NMIE vector address within the embedded memory of the IC. Once operation of the CPU has been interrupted, a means must be provided for notifying the external emulator system so that the external system can begin executing user-specified operations of the ICE in the interrogation mode. According to the present invention, this is done by implementing the CORE CMD register as a bi-directional communications register that can be read from and written to by both the CPU and the external emulator system despite the fact that the CPU is running at a different speed than the external system.

Using this bi-directional communications register in addition to a selector means having a hardware pointer and a point setter implemented in hardware, the CPU can continually poll the break bit until it is found to be set and then acknowledge to the external emulator system that the IC has been placed in the interrogation mode by overwriting the set break bit written into the CORE CMD register with a binary zero. In execution of a subsequent RISM ACTION command, the external system instructs the RISM ACTION register to load the modified bits of the previous RISM ACTION command stored in the CORE registers. The command is then serially transmitted to the external system where the deallocated break bit can be detected and interrogation of the IC can proceed.

With respect to break bit cell of the RISM CMD register chain, the value within the bit cell is transmitted from the output of the bit cell to the selector means which is also coupled to the output of a corresponding bit cell of the CORE CMD register. The selector means comprises a selector multiplexor having as a first input a data bit of the RISM CMD break bit cell, as a second input a data bit of the CORE CMD break bit cell and as a third enable input the output of an SR flip-flop. The SR flip-flop has as a first input a synchronized UPDR signal and as a second input a write signal from the CPU for outputting low and high signals to the enable of the selector multiplexor for selecting as output from the multiplexor the first and second inputs upon assertion of the synchronized UPDR and write signals, respectively. The output of the multiplexor is then transmitted to the CPU upon assertion of a read signal from the CPU so that the CPU can determine if an interrupt request has been issued by the external system.

Upon detecting a set break bit, the CPU then writes a binary zero (i.e., an interrupt acknowledgment) to the break bit cell of the CORE CMD register via a peripheral data bus. The modified break bit is then transmitted from the CORE CMD break bit cell to the corresponding RISM CMD break bit cell where it is subsequently output to the external system to inform the external system that it may proceed with interrogation of the IC.

BRIEF DESCRIPTION OF THE DRAWINGS

The objects, features and advantages of the present invention will become apparent from the following detailed description in which.

DETAILED DESCRIPTION OF THE INVENTION

A method and apparatus for enabling asynchronous, bi-directional communication between the CPU of a CPU-based IC and an external system having digital logic for effecting transitions between operating modes of the IC is described. In the following description, numerous details such as specific steps in the testing procedure, specific architectural units, etc. are given in order to provide a thorough understanding of the present invention. It will be obvious, however, to one skilled in the art that not all the details given are required to practice the present invention. In other instances, well-known system components, test features, methods and the like are not set forth in detail in order to avoid unnecessarily obscuring the description of the present invention. A list of acronyms and their descriptions is provided in Table 1.

TABLE 1

| Acronym | Description |
| --- | --- |
| ADDR | address |
| CAPNUP | capture and update |
| CLKDR | clock signal |
| CMD | command |
| CPU | microprocessor |
| DIN | data input |
| DOUT | data output |
| DSP | digital signal processor |
| FGO | fast go |
| IC | integrated circuit |
| ICE | in-circuit emulator |
| IEEE | Institute of Electrical and Electronics Engineers |
| IR | instruction register |
| ISR | interrupt service routine |
| MIU | memory interface unit |
| NMIE | non-maskable interrupt |
| PH1 | first clock signal |
| PH2 | second clock signal |
| PIU | peripheral interface unit |
| RAM | random access memory |
| RISM | reduced instruction set monitor |
| ROM | read only memory |
| SHDR | shift signal |
| TAP | standard test access port and boundary scan architecture |
| TCK | test clock input |
| TDI | test data in |
| TDO | test data out |
| TMS | test mode select |
| TRST | test reset input |
| UPDR | update signal |

According to the present invention, a micro-processor (or CPU) based integrated circuit (IC) is provided having embedded memory (or an on-chip cache) and an in-circuit emulator (ICE) unit 3 for imitating the behavior of the IC and executing debugging micro-code 14 stored in the embedded memory. The ICE unit 3 operates in an emulation mode where real-time event evaluation is conducted during normal operation of the IC and an interrogation mode where the ICE unit 3 communicates with an external emulator system 32 (or an evaluation board coupled to a computer) to interrogate the IC for register values and to execute programs stored in memory. Although the present invention is described with respect to an asynchronous, bi-directional communications register for use in a CPU-based IC having an ICE unit coupled to an external emulator system, it will be apparent to those skilled in the art that the communications register can be implemented between any two logic elements which need to asynchronously update information shared between them.

Figure 1:
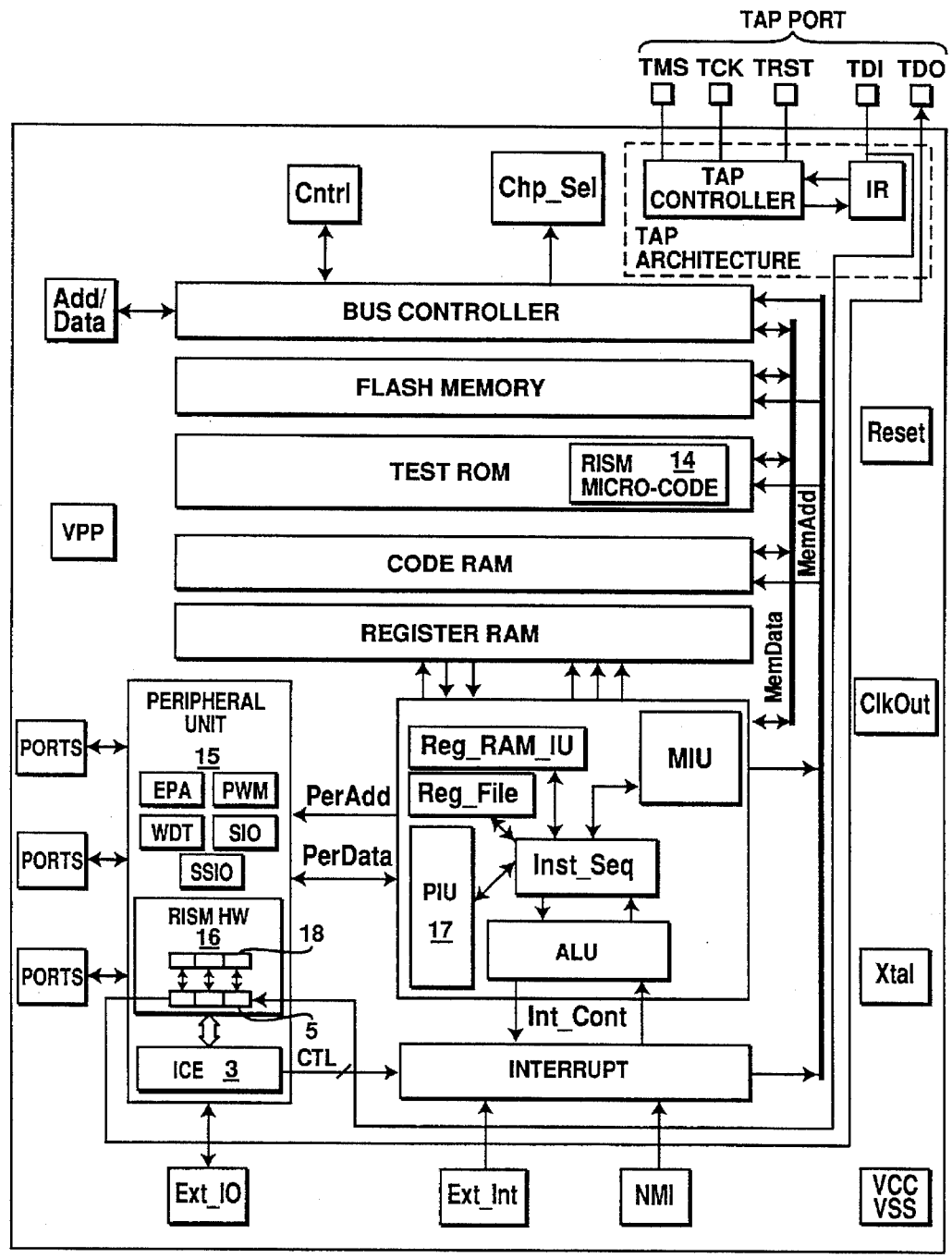
FIG. 1 is a block diagram of a micro-controller integrated circuit architecture showing a generalized implementation of the TAP architecture in addition to the hardware of a reduced instruction set monitor (RISM) disposed within the peripheral unit.

In the preferred embodiment, shown in FIG. 1, the CPU-based IC comprises a micro-controller manufactured by Intel Corporation. The micro-controller comprises embedded memory modules including a Flash Memory, a Test ROM, a Code RAM and a Register RAM. A memory interface unit (MIU) is provided for controlling accesses to memory outside of the micro-controller register file (Reg_file) by means of memory access circuitry and a memory bus (MemData and MemAdd). The de-bugging micro-code 14 comprises a "Reduced Instruction Set Monitor" (RISM) micro-code 14 stored within the test ROM module.

In addition to the RISM micro-code 14, RISM hardware 16 is provided in a peripheral unit 15 of the micro-controller having connections to a peripheral interface unit (PIU) 17 via a peripheral bus for accessing the embedded memory. The RISM micro-code 14 within the Test ROM together with the RISM hardware 16 residing in the peripheral unit 15 enable reads and writes to memory locations and jumps to other codes stored anywhere in memory for execution. In this manner, the RISM sections of the micro-controller architecture act as the primary communication interface between the ICE unit 3 and the external emulator system 32 for interrogation of the IC by the external system 32. Accordingly, the C296 controller architecture provides the necessary information to the external system 32 needed to perform real time transparent emulation, non-slip break, break sequencing in addition to fast and permanent interrogation capabilities.

Figure 3:
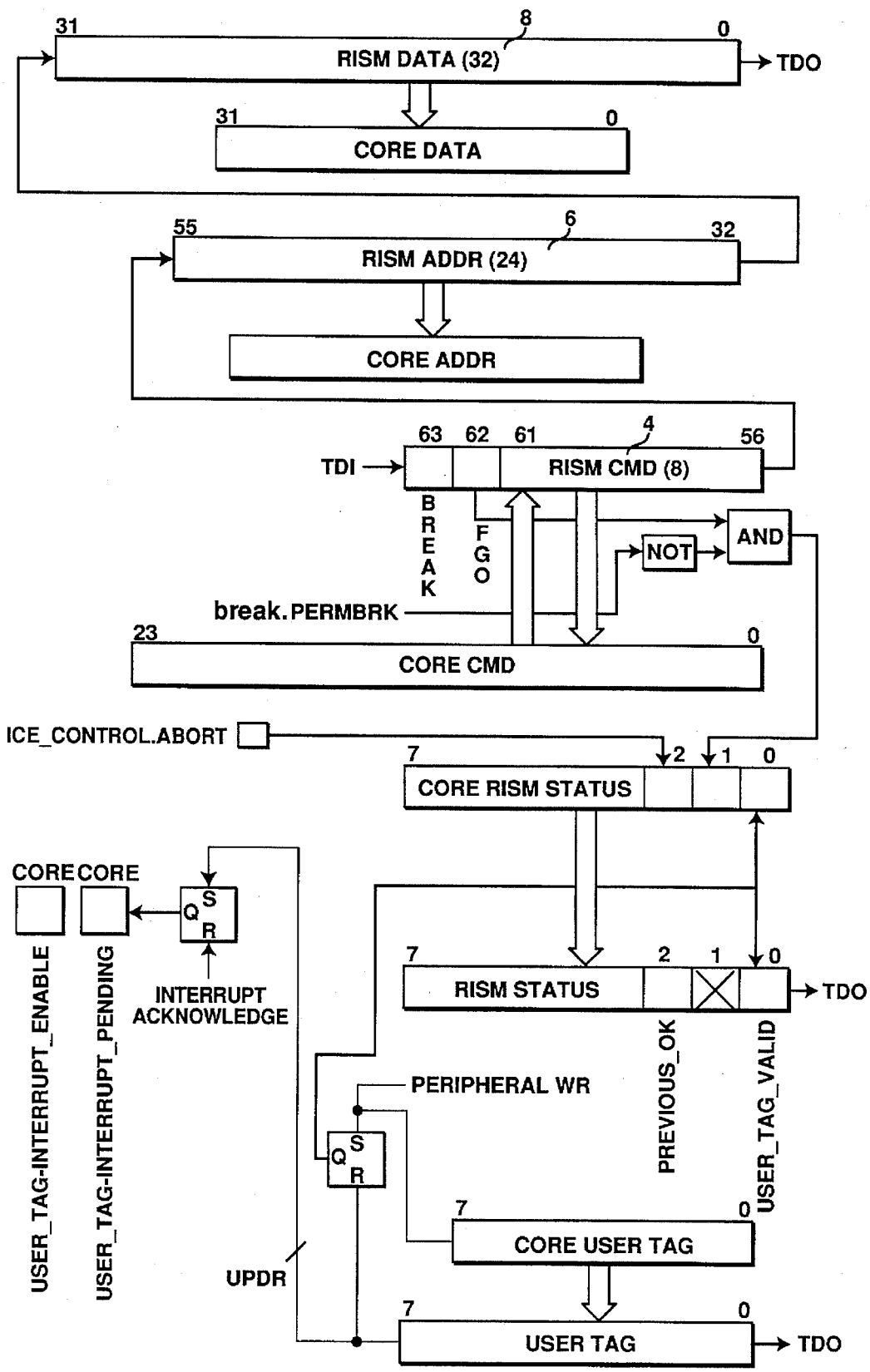
FIG. 3 is a block diagram of the RISM ACTION register chains and their interface/with the CORE registers.

As shown in FIG. 3, the RISM hardware 16 comprises a RISM ACTION register 5 having three register chains which interface with five RISM special function registers of the IC. The RISM ACTION register 5 includes a RISM CMD chain 4 (8 bits) coupled in parallel to a corresponding CORE CMD register 21, a RISM ADDR chain 6 (24 bits) coupled in parallel to a corresponding CORE ADDR register 22 and a RISM DATA chain 8 (32 bits) coupled in parallel to a corresponding CORE DATA register 23. The RISM ADDR chain 6 holds the address for memory location reads and writes or the address for branch operations, whereas the RISM DATA chain 8 holds the data for a write operation or the result data of a read operation. The RISM CMD chain 4 is used to hold 6 bit macro-instructions "RISM commands") which essentially instruct the CPU (via the PIU) of the location where the CPU is to jump in the RISM micro-code for execution of the corresponding micro-code routines. To accomplish this, the RISM commands (illustrated in the Table below) actually form the address locations (shifted right by two bits) in a break interrupt service routine (ISR) which hold the addresses of the TROM locations where the CPU will jump for execution of the specified RISM operation. In addition, to control transition of the ICE unit's operation between the emulation and interrogation modes, the RISM CMD chain 4 further comprises a break bit cell (bit 7) and a fast go (FGO) bit cell (bit 6) for signaling inter alia an interrupt to the CPU upon execution of a RISM command.

| Address | Command Label | Description |
| --- | --- | --- |
| 2CH | idle | initial RISM_CMD value after ICE unit 3 reset |
| 34H | read_byte | read a byte |
| 3CH | read_word | read a word |
| 44H | read_long | read a long |
| 4CH | write_byte | write a byte |
| 54H | write_word | write a word |
| 5CH | write_long | write a long |
| 64H | read_dsp | read DSP accumulator and controls |
| 70H | write_dsp | write DSP accumulator value |
| 84H | write_dsp_ctrl | write DSP accumulator value and controls |
| 90H | call_other | call another RISM-compatible function |
| A8H | execute_other | jump to another RISM-compatible code fragment |
| B0H | go | enter emulation |
| FCH | RISM_prog | special version of call_other which programs the flash memory |

Figure 2:
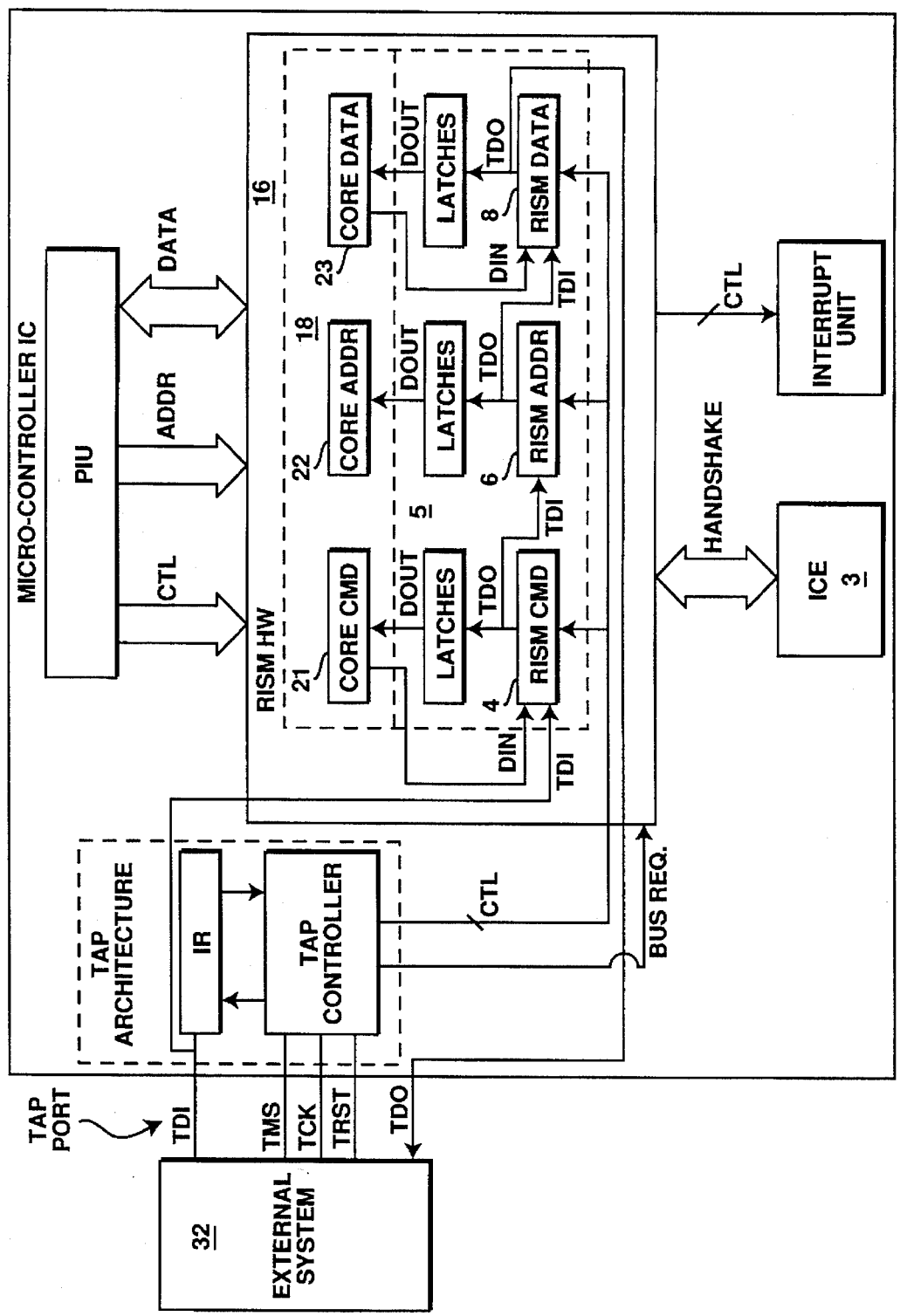
FIG. 2 is a more specific block diagram of the RISM ACTION register and the corresponding CORE registers within the peripheral unit of the micro-controller.
Figure 5A:
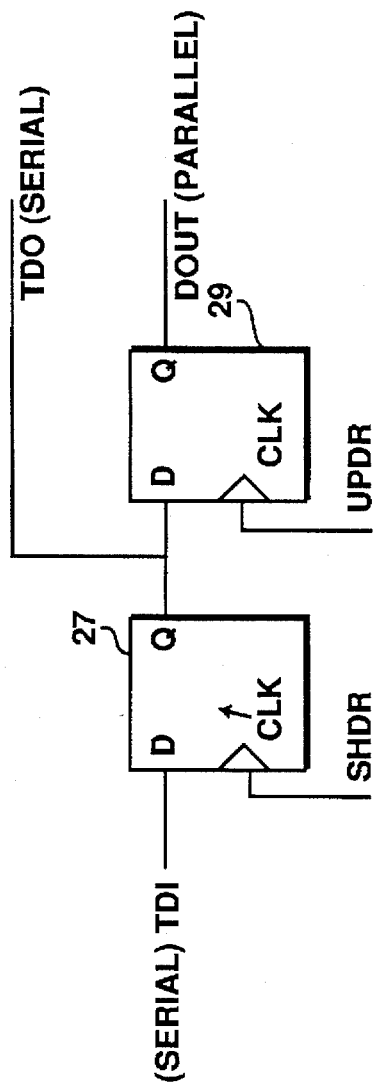
FIG. 5(a) is a schematic diagram of a bit cell for a update only type register utilized in the RISM ACTION ADDR register chain.
Figure 5B:
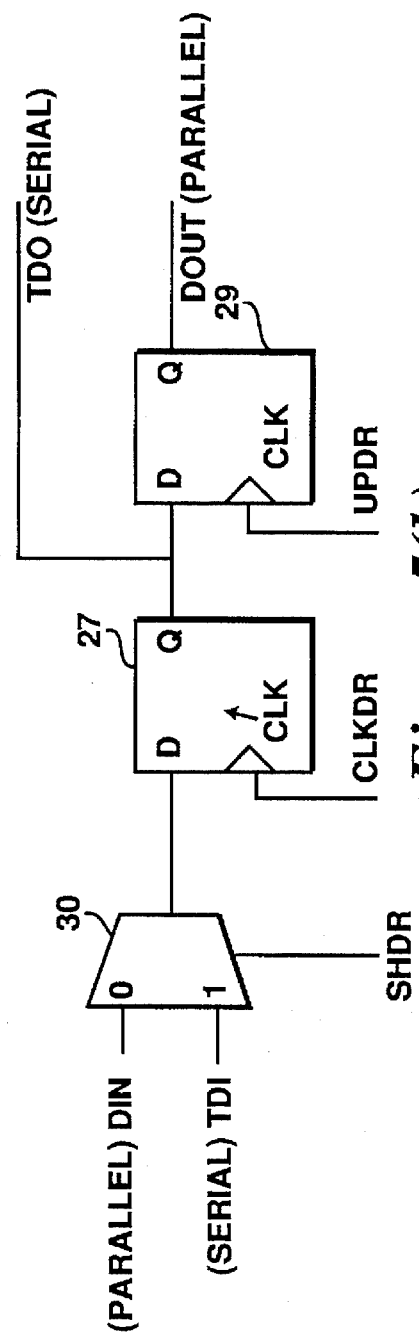
FIG. 5(b) is a schematic diagram of a bit cell for a capture and update type register utilized in the RISM ACTION CMD and RISM ACTION DATA register chains.

In implementation of the RISM ACTION register 5 within the RISM hardware 16, as shown in FIG. 2, the RISM ADDR chain 6 of the register comprises "update only" type bit cells (shown in FIG. 5(a)) to form an "UPDATE ONLY" shift register chain capable of serial shifting and parallel writing of bits. The RISM CMD and DATA chains 4, 8, on the other hand, comprise "capture and update" type bit cells (shown in FIG. 5(b)) to form "CAPNUP" shift register chains capable of parallel loading, serial shifting and parallel writing of bits. As shown in FIGS. 5a and 5b, each the UPDATE and CAPNUP type bit cells preferably comprise an edge triggered master/slave D-flip-flop 27 and a level sensitive latch 29 coupled together as shown for performing the above-described functions. For the CAPNUP type bit cells, a multiplexor 30 is further added for selecting between the parallel data in (DIN) from the corresponding CORE registers 21, 22, 23 and the serial data in (TDI) from one of the TDI input pin of the IC and a previous bit cell of the respective chain (4 or 8). To control the operation of the bit cells of each of the RISM ACTION register chains 4, 6, 8, control signals in the form of a shift signal (SHDR), an update signal (UPDR) and a clock signal (CLKDR) are transmitted from the external system 32 to each of the bit cells of the respective register chains.

In addition to the registers described above, the RISM special function registers (shown in FIG. 3) comprise a RISM STATUS register for updating the status of command execution to the external emulator system 32 and a USER TAG register for transferring information from the IC during emulation to the external system 32 without resorting to a break or interrupt in the IC's operation. Furthermore, the ICE unit 3 itself comprises three registers (not shown) forming an ICE CONTROL register for configuring break points in the ICE operation, an ICE CAUSE register for logging all break causes for the external system 32 and an ICE EVENT register for storing two instruction pointer break points.

In order to establish a communications interface between the external emulator system and the ICE unit, the RISM registers are located such that they are accessible through a single vertical window setting. In the preferred embodiment of the present invention, this is accomplished using the serial interface described in the IEEE document entitled IEEE Standard Test Access Port and Boundary-Scan Architecture (IEEE Std. 1149.1-1190), this document being incorporated herein by reference. This IEEE standard developed by the Test Technology Technical Committee of the IEEE. Computer Society sets forth a mechanism (referred to herein as the "TAP architecture") for accessing the internal workings of an IC in order to 1) test the interconnections between integrated circuits once they have been assembled onto a printed circuit board, 2) test the IC itself and 3) observe or modify the activity of the IC during its normal operation.

The objective of the Standard is to provide a means for accessing and a means for controlling design-for-test features which are built directly into the IC's themselves. This is accomplished by providing an input/output architecture that enables test instructions and associated test data to be serially fed into the IC, while the results of the execution of such instructions are serially read out. The test logic is designed such that the serial movement of instructions and data, controlled by an external host (i.e., the emulator system 32), is not apparent to those circuit blocks whose operation is controlled by the instruction.

With reference to FIGS. 1 and 2, the TAP architecture of the present invention comprises a TAP port, a TAP controller and an instruction register IR serially coupled to the RISM registers and the ICE registers through use of an input multiplexor and an output multiplexor (not shown). The TAP port comprises a plurality of input and output ports including 1) a test clock input pin (TCK) for clocking the TAP controller asynchronously with respect to the CPU's driving clock, 2) a test mode select pin (TMS) for controlling the operation of the TAP controller, 3) a test data in pin (TDI) for serially transmitting data and instruction signals to the instruction register and other internal IC registers, 4) a test data out pin (TDO) for serially receiving data and instruction signals output from the instruction register and the other internal IC registers and 5) a test reset input pin (TRST) for providing asynchronous initialization of the TAP controller.

The TAP controller contains a synchronous finite state machine that responds to changes of the TMS pin on rising edges of the TCK pin and controls the sequence of operations of the TAP circuitry. The TAP controller is coupled to the plurality of ICE and RISM registers in addition to being coupled in parallel to the instruction register IR, which forms a four bit shift register, for controlling the timing and operation of the registers and the serial input and output to and from the TAP architecture. The instruction register IR is used to select the TAP operation to be performed and/or the register to be accessed by serially shifting an instruction into the instruction register IR and latching the instruction into the finite state machine at the completion of the shifting.

In order to shift the RISM ACTION information into the RISM ACTION register 5 via the TAP architecture, a data string comprising 64 bits is serially input to the RISM ACTION register chains 4, 6, 8 via the TDI input pin of the IC by applying the SHDR command signal (64 times) from the TAP controller. At the same time, the old data string stored in the RISM ACTION register chains 4, 6, 8 is serially shifted out through the TDO output pin. To write the bits stored in the flip-flops of the RISM ACTION register chains 4, 6, 8 to the bit cells of their corresponding CORE registers 21, 22, 23, the UPDR command signal is applied to load the bits from the flip-flops 27 to the level sensitive latches 29 where they are subsequently written in parallel to the bit cells of the CORE registers 21, 22, 23. In order to load the bits from the CORE DATA register 23 and the CORE CMD register 21 into their corresponding RISM DATA chain 8 and RISM CMD chain 4, the SHDR command signal is applied to the multiplexor 30 of each bit cell of the chains to select the parallel DIN as input to the flip-flops 27 while the CLKDR signal is applied to the flip-flops 27.

Referring again to FIG. 1, the micro-controller further comprises an interrupt unit (INTERRUPT) having break logic for interrupting the controller's current stream of instructions during the emulation mode and entering the interrogation mode. To do this, the break logic issues a non-maskable interrupt (NMIE) to the interrupt unit upon detecting an external ICE break interrupt from the emulator system 32 (i.e., toggling the NMIE pin of the IC) or upon detecting execution of a RISM command.

To enter the interrogation mode by means of executing a RISM command, the RISM ACTION data string is serially input to the RISM ACTION register 5 via the TAP architecture when the IC is still in the emulation mode (i.e., normal operation). The RISM ACTION data string comprises a RISM data field (ignored for read operations), a RISM address field, and a RISM command field including a FGO bit and a break bit. In order to effect transition from emulation mode to interrogation mode upon execution of the RISM command, the break bit in the RISM CMD register chain 4 must be set (i.e., a binary one) so as to invoke the NMIE. Upon assertion of an UPDR signal from the external system 32 via the TAP controller to the RISM ACTION register 5 (causing execution of the RISM ACTION command), the bits in the RISM ACTION register 5 are written in parallel to the corresponding CORE registers 21, 22, 23.

At this time, the break logic detects the set break bit upon update of the RISM ACTION register 5 and issues the NMIE to the interrupt unit. The interrupt unit transfers processor control from the user's code to the RISM micro-code 14 stored at the NMIE vector address within the test ROM. Additionally, when the break bit is set during update of the RISM ACTION register 5, the break logic will check the FGO bit to determine whether to invoke a permanent break (FGO bit not set) where more than one RISM ACTION command will be executed or a fast break (FGO bit set) where only one RISM ACTION command will be executed after completion of any current core instruction. After completion of a single RISM ACTION command during a fast break, the RISM micro-code 14 automatically returns control back to the user's code.

Once a break has been requested by means of the break logic detecting the set break bit and issuing a NMIE, a means must be provided for notifying the external emulator system 32 that the break has been accepted by the CPU in order that the external system 32 can begin executing the user-specified ICE operations during the interrogation mode. According to the present invention, this is done by implementing the CORE CMD register 4 as a bi-directional communications register and providing a selector means having a pointer 40 and a point setter 38 implemented in hardware. In this way, the CORE CMD register can be read from and written to by both the CPU and the external emulator system 32 despite the fact that the CPU and the external system are operating asynchronously (i.e., approximately 100 MHz as compared to 5 Khz, respectively). Thus, the break logic of the IC can continually poll the break bit until it is found to be set and then acknowledge to the external emulator system 32 that the IC has been placed in the interrogation mode by overwriting the set break bit updated (i.e., written) to the CORE CMD register 4 with a binary zero. In execution of a subsequent RISM command, the external system 32 instructs the TAP architecture to capture (i.e., load) the modified bits of the previous RISM command stored in the CORE registers 21, 22, 23 into the RISM ACTION register 5. The command is then serially transmitted to the external system where the deallocated break bit (i.e., a binary zero) can be detected and interrogation of the IC can proceed.

Figure 4:
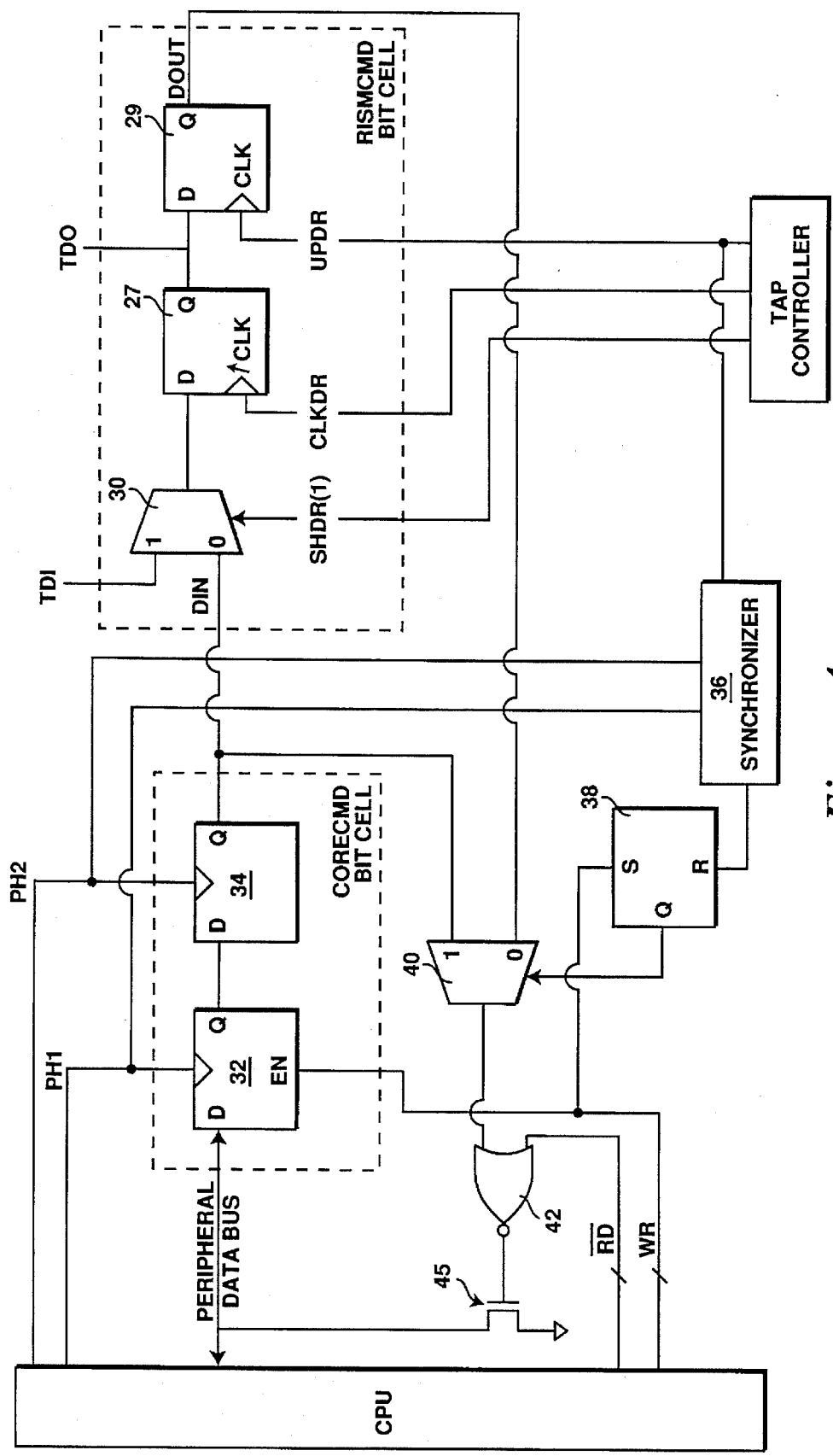
FIG. 4 is a circuit diagram of a pair of corresponding bit cells in the RISM ACTION CMD register chain and the CORE CMD register.

With reference to FIG. 4, in which a pair of corresponding bit cells (and interface circuitry) forming bit cells of the RISM CMD register chain 4 and the CORE CMD register 21 is shown, the use of the CORE CMD register 21 as a bi-directional communications register for notifying the external system 32 of a CPU break acknowledgment will be described. After the RISM ACTION data string has been serially input to the RISM ACTION register 5 as described above, the external system 32 asserts an UPDR signal to the register chains 4, 6, 8 via the TAP controller to write the bits in parallel to the respective CORE registers 21, 22, 23.

In terms of the bits in the RISM CMD register chain 4, these bits are transmitted from the DOUT output of their bit cells to respective selector means which are also coupled to the output of the bit cells of the CORE CMD register 21. The selector means for each corresponding pair of bit cells comprises a hardware pointer forming a 2:1 (selector) multiplexor 40 and a point setter forming an SR flip-flop 38. The selector multiplexor 40 has as a first input a data bit of the RISM CMD bit cell, as a second input a data bit of the CORE CMD bit cell and as a third enable input the output of the SR flip-flop 38. The SR flip-flop 38 has as a first input a synchronized UPDR signal (synchronized to the timing of the CPU) and as a second input a write signal from the CPU for outputting low and high signals to the enable of the selector multiplexor 40 for selecting between the first and second inputs upon assertion of the synchronized UPDR and write signals, respectively. The SR flip-flop 38 establishes a fixed priority between the synchronized UPDR and write signals by selecting the first input to the selector multiplexor 40 (i.e., from the RISM CMD break bit cell) in the case of a simultaneous assertion so as to select the most current value (of the break bit) input from the external system 32.

In order to enable the CPU to promptly determine when an interrupt request has been issued from the external system 32, the output of the selector multiplexor 40 for each bit cell is input along with a CPU read signal to a corresponding NOR gate 42 having its output coupled to a precharged bit line (via a CMOS transistor 45) of a peripheral data bus for reading the most current value of the break bit input from the external system 32. Upon detecting the set break bit, the CPU then writes a binary zero (i.e., an interrupt acknowledgment) to the break bit cell of the CORE CMD register 21 via the peripheral data bus. This is accomplished by providing each bit cell of the CORE CMD register 21 with a first DQ flip-flop 32 having as a first input the data bit value of the precharged bit line, as a second input a first clock signal (PH1) of the CPU and as a third enable input the write signal from the CPU. Each bit cell of the CORE CMD register 21 further comprises a second DQ flip-flop 34 having as a first input an output from the first DQ flip-flop 32 and having as a second input a second clock signal (PH2) from the CPU for outputting the new value of the break bit to a common connection between the second input to the selector multiplexor 40 and a DIN input of the corresponding RISM CMD break bit cell.

Upon assertion of the next CLKDR signal to the RISM CMD break bit cell by the external system 32, the new value in the CORE CMD break bit cell is input via an input multiplexor 30 to a DQ flip-flop 27 of the RISM CMD break bit cell. The input multiplexor 30 for each RISM CMD bit cell has a first input from one of a preceding bit cell of the RISM CMD register chain 4 and the TDI input pin and a second input from a corresponding bit cell of the CORE CMD register 21. The output of the DQ flip-flop 27 is coupled to both an input of a level sensitive latch 29 and one of a subsequent bit cell of the RISM CMD register chain 4 and a subsequent bit cell of the RISM ADDR register chain 6 (as shown in FIG. 3). The output of the level sensitive latch 29 is coupled to the first input of the selector multiplexor 40. Finally, each of the input multiplexor 30, the DQ flip-flop 27 and the level sensitive latch 29 of each RISM CMD bit cell have as input from the external system 32 (via the TAP controller) a SHDR signal, a CLKDR signal and an UPDR signal, respectively, for controlling the input and output operations of the RISM CMD bit cells.

Through the use of the method and apparatus of the present invention, it is thus possible to implement the CORE CMD register 21 as a bi-directional communications register which stores an interrupt request received from the external emulator system 32 and allows the CPU to asynchronously overwrite the request with an interrupt acknowledgment upon ceasing operations to memory. As explained above in conjunction with the preferred embodiment of the present invention, the use of the TAP architecture and logic further enables serial transmission of data between the IC and an external system so as to minimize the number of IC connection pins required to effect transitions between operating modes of the IC.

While the invention has been described in conjunction with the preferred embodiment, it is evident that numerous alternatives, depictions, variations and uses will be apparent to those skilled in the art in light of the foregoing description. Thus, it is understood that the invention is not to be limited by the foregoing illustrative details, but rather is to be defined by the appended claims.

I claim:

1. An apparatus for enabling bi-directional communication between a first logic means having a first associated register and a second logic means having a second associated register, the first and second logic means operating asynchronously with respect to each other, the apparatus comprising:

selector means coupled in parallel to the first register and the second register for receiving as a first input a first value comprising a plurality of binary data bits stored in the first register and receiving as a second input a second value comprising a plurality of binary data bits stored in the second register, the selector means further having as input a write signal from the second logic means and a synchronized update signal from the first logic means for selecting as output from the selector means one of the first input and the second input in response to assertion of the synchronized update signal and assertion the write signal, respectively, the synchronized update signal being synchronized to the timing of the second logic means; and the second register having as a parallel input the output of the selector means for transmitting one of the first input and the second input to the second register, the second register further coupled in parallel to the first register for subsequently transmitting a current value in the second register to the first register upon assertion of a capture signal from the first logic means to the first register.

2. The apparatus of claim 1, wherein the first and second registers comprise corresponding pairs of bit cells for holding the plurality of binary data bits forming the first and second values stored in the first and second registers, respectively.

3. The apparatus of claim 2, wherein the selector means for each corresponding pair of bit cells comprises a multiplexor having as a first input a data bit of the first value forming the first input to the selector means and having as a second input a data bit of the second value forming the second input to the selector means, the selector means further comprising an SR flip-flop having a first input and a second input, the SR flip having as input to the first input and the second input the write signal from the second logic means and the synchronized update signal from the first logic means, respectively, the SR flip-flop further having an output coupled to the multiplexor as an enable for selecting as output from the multiplexor one of the data bit of the first input and the data bit of the second input upon assertion of the synchronized update signal and assertion of the write signal, respectively.

4. The apparatus of claim 3, wherein the apparatus further comprises for each bit cell of the second register a NOR gate having an output coupled to the gate of a MOS transistor, the MOS transistor having a source coupled to a precharged bit line of a bit cell of the second register and a drain coupled to ground, the NOR gate having as a first input the output of the multiplexor and having as a second input a read signal from the second logic means to enable a read of the output from the multiplexor by the second logic means upon assertion of the read signal.

5. The apparatus of claim 3, wherein each bit cell of the first register comprises an input multiplexor, a DQ flip-flop and a level sensitive latch, the input multiplexor having a first input from one of a preceding bit cell of the first register and an external input connection and a second input from a corresponding bit cell of the second register, the multiplexor further having an output coupled as input to the DQ flip-flop, the DQ flip-flop having an output coupled to both an input of the level sensitive latch and one of a subsequent bit cell of the first register and an external output connection, the level sensitive latch having an output coupled to the first input of the multiplexor of the selector means, the first logic means having a select signal coupled as an enable to the input multiplexor for selecting one of the first and second inputs to the input multiplexor, a clock signal coupled to a clock input of the DQ flip-flop for clocking the DQ flip-flop and an update signal coupled to a clock input of the level sensitive latch for clocking the latch.

6. The apparatus of claim 3, wherein the second logic means generates first and second clock signals and comprises a data bus having precharged bit lines coupled to the bit cells of the second register, each bit cell of the second register comprising a first DQ flip-flop having as a first input a precharged bit line of the data bus and having as a second input the first clock signal of the second logic means, the first DQ flip-flop further having as a third enable input the write signal from the second logic means for enabling writes from the second logic means to the first DQ flip-flop upon assertion of the write signal, each bit cell of the second register further comprising a second DQ flip-flop having as a first input an output from the first DQ flip-flop and having as a second input the second clock signal from the second logic means, the second DQ flip-flop having an output coupled to the first input of the multiplexor of the selector means.

7. The apparatus of claim 1, wherein the second logic means comprises a central processing unit (CPU) disposed within an integrated circuit and the first logic means comprises an central processing unit (CPU) external to the integrated circuit, the integrated circuit having an input/output means for transmitting signals between the external CPU and the integrated circuit, the input/output means comprising an input register coupled to the external CPU for receiving signals input to the integrated circuit from the external CPU, an output connection for coupling signals output from the integrated circuit to the external CPU and an input/output controller coupled to the input register and the external CPU for controlling operation of the input register in response to the signals input to the integrated circuit from the external CPU.

8. A method for bi-directional communication between a first logic means having a first associated register and a second logic means having a second associated register, the first and second logic means operating asynchronously with respect to each other, the method comprising the steps of:

transmitting in serial a first value from the first logic means to the first register, the first register having a first parallel connection to the second register for the transmission of values from the second register to the first register;

transmitting an update signal from the first logic means to the first register to write the first value in parallel as a first input to a selector means, the selector means being coupled in parallel to the first parallel connection between the first and second registers for receiving as a second input values transmitted from the second register to the first register;

transmitting the update signal from the first logic means to a synchronizer having as input a clock signal from the second logic means;

synchronizing the update signal with the clock signal to produce as output from the synchronizer a synchronized update signal;

transmitting the synchronized update signal from the synchronizer to the selector means, the selector means further having as input a write signal from the second logic means;

selecting as output from the selector means one of the first input and the second input to the selector means in response to assertion of the update signal by the first logic means and assertion of the write signal by the second logic means, respectively;

transmitting the output from the selector means in parallel to the second register;

transmitting in parallel a second value from the second logic means to the second register to replace the first value in the second register with the second value;

transmitting in parallel the second value in the second register to the first register upon assertion of a capture signal to the first register by the first logic means; and transmitting in serial the second value in the first register to the first logic means.

9. The method of claim 8, wherein the first and second registers comprise corresponding pairs of bit cells for holding a plurality of binary data bits forming the first and second values stored in the first and second registers, respectively.

10. The method of claim 9, wherein the selector means for each corresponding pair of bit cells comprises an SR flip-flop having first and second inputs and a multiplexor having first, second and third inputs, and the step of selecting as output from the selector means one of the first input and the second input to the selector means is performed by the steps of:

transmitting to the first input of the multiplexor a data bit of the first value of the first register;

transmitting to the second input of the multiplexor a data bit of the second value of the second register;

transmitting to the first input of the SR flip-flop the synchronized update signal output from the synchronizer;

transmitting to the second input of the SR flip-flop the write signal from the second logic means; and outputting from the SR flip-flop to the third input of the multiplexor an enable signal for selecting as output from the multiplexor one of the data bit of the first value and the data bit of the second value upon assertion of the synchronized update signal and assertion of the write signal to the SR flip-flop, respectively.

11. In a micro-controller integrated circuit (IC) having embedded memory and an in circuit emulator for imitating the behavior of the IC and executing debugging micro-code 14 stored in the embedded memory upon placing the IC in an interrogation mode, a method is provided for requesting a transition from normal operation of the IC to the interrogation mode and acknowledging from the micro-controller to an emulator control system disposed external to the IC that the transition has occurred, the method comprising the steps of:

transmitting in serial a first value forming a transition request from the emulator system to a first register disposed within the IC, the first register having a first parallel connection to a second register for the transmission of values from the second register to the first register;

transmitting an update signal from the emulator system to the first register to write the first value in parallel as a first input to a selector means, the selector means being coupled in parallel to the first parallel connection between the first and second registers for receiving as a second input values transmitted from the second register to the first register;

transmitting the update signal from the emulator system to a synchronizer having as input a clock signal from the micro-controller;

synchronizing the update signal with the clock signal to produce as output from the synchronizer a synchronized update signal;

transmitting the synchronized update signal from the synchronizer to the selector means, the selector means further having as input a write signal from the micro-controller;

selecting as output from the selector means one of the first input and the second input to the selector means in response to assertion of the update signal by the emulator system and assertion of the write signal by the micro-controller, respectively;

transmitting the output from the selector means in parallel to the second register;

transmitting in parallel a second value forming a transition acknowledgment from the micro-controller to the second register to replace the first value in the second register with the second value;

transmitting in parallel the second value in the second register to the first register upon assertion of a capture signal to the first register by the emulator system; and transmitting in serial the second value in the first register to the emulator system.

12. The method of claim 11, wherein the first and second registers comprise corresponding pairs of bit cells for holding a plurality of binary data bits forming the first and second values stored in the first and second registers, respectively.

13. The method of claim 12, wherein the selector means for each corresponding pair of bit cells comprises an SR flip-flop having first and second inputs and a multiplexor having first, second and third inputs, and the step of selecting as output from the selector means one of the first input and the second input to the selector means is performed by the steps of:

transmitting to the first input of the multiplexor a data bit of the first value of the first register;

transmitting to the second input of the multiplexor a data bit of the second value of the second register;

transmitting to the first input of the SR flip-flop the synchronized update signal output from the synchronizer;

transmitting to the second input of the SR flip-flop the write signal from the second logic means; and outputting from the SR flip-flop to the third input of the multiplexor an enable signal for selecting as output from the multiplexor one of the data bit of the first value and the data bit of the second value upon assertion of the synchronized update signal and assertion of the write signal to the SR flip-flop, respectively.

14. An apparatus for enabling bi-directional communication between a first logic circuit and a second logic circuit operating asynchronously to each other, the apparatus comprising:

a first register coupled to the first logic circuit;

a second register coupled to the second logic circuit by a data bus, the first and second registers including corresponding pairs of bit cells for storing a first plurality of bits and a second plurality of bits, respectively, the first register receiving a current value stored in the second register in response to a capture signal from the first logic circuit;

a synchronizer for synchronizing an update signal from the first logic circuit with a timing of the second logic circuit to generate a synchronized update signal; and a selector coupled to the first and second registers for receiving the first and the second plurality of bits, the selector providing a selector output corresponding to one of the first and second plurality of bits to the data bus in response to a write signal from the second logic circuit and the synchronized update signal.

15. The apparatus of claim 14, wherein the data bus includes precharged bitlines associated with the bit cells of the second register, wherein the selector couples selected precharged bitlines of the data bus to a signal ground in response to a read signal from the second logic circuit, wherein the selected precharged bitlines are selected in accordance with one of the first and second plurality of bits.

16. The apparatus of claim 15, wherein the selector comprises:

a plurality of SR flip-flops, each SR flip-flop associated with an associated corresponding pair of bit cells, each SR flip-flop receiving the write signal and the synchronized update signal and providing an SR output; and a plurality of multiplexors, each multiplexor associated with an associated corresponding pair of bit cells for selecting one of the associated corresponding bit cells in response to the SR output of its associated SR flip-flop.

17. The apparatus of claim 16, wherein the selector further comprises:

an associated logic gate for each multiplexor of the plurality of multiplexors, an output of each logic gate coupled to a gate terminal of an associated transistor, the transistor having a first terminal coupled to one bit line of the data bus and a second terminal coupled to ground, the logic gate providing a gate output signal corresponding to a multiplexor output signal in response to a read signal from the second logic circuit.

18. The apparatus of claim 14, wherein each bit cell of the first register comprises:

an input multiplexor, the input multiplexor having a first input from one of a preceding bit cell output of the first register and an external input connection, the input multiplexor having a second input from the corresponding bit cell of the second register; the input multiplexor selecting one of the first and second inputs in response to a select signal provided by the first logic circuit;

a first latch, coupled to receive an input multiplexor output, the first latch providing a first latch output for one of a subsequent bit cell of the first register and an external output connection, the first latch latching in response to a clock signal;

a second latch having a second latch output coupled to the first input of the multiplexor of the selector, the second latch latching in response to an update signal from the first logic circuit, wherein the second latch is a level sensitive latch.

19. The apparatus of claim 18 wherein the first latch comprises an edge-triggered D flip-flop and the second latch comprises a level sensitive D flip-flop.

20. The apparatus of claim 14, wherein each bit cell of the second register further comprises:

a first latch coupled to a corresponding bit line of the data bus, the first latch clocked by a first clock signal from the second logic circuit, the first latch enabled for clocking by the write signal; and a second latch coupled to receive an output of the first latch, wherein the second latch is a level sensitive flip flop clocked by a second clock signal provided by the second logic circuit.

21. The apparatus of claim 20 wherein the first latch comprises an edge-triggered D flip-flop and the second latch comprises a level sensitive D flip-flop.

22. The apparatus of claim 14, wherein the second logic circuit comprises a microcontroller disposed within an integrated circuit and the first logic circuit is external to the integrated circuit, the integrated circuit having an input/output control circuit, wherein the input/output control circuit controls the first register to serially communicate data between the first logic circuit and the first register in response to control signals from the first logic circuit.

23. A method for bi-directional communication between a first logic circuit having a first associated register and a second logic circuit having a second associated register, the first and second logic circuits operating asynchronously with respect to each other, the method comprising the steps of:

a) transmitting from the first logic circuit to the second logic circuit by performing the steps of:
  i) serially transmitting a first value from the first logic circuit to the first register;
  ii) latching the first value in the first register in response to an update signal from the first logic circuit;
  iii) synchronizing the update signal with a clock signal from the second logic circuit to produce a synchronized update signal;
  iv) selecting a selected register from one of the first and second registers in accordance with the synchronized update signal and a write signal from the second logic circuit; and
  v) transmitting in parallel a selected value of the selected register to the second register and the second logic circuit in response to a read signal from the second logic circuit;

b) transmitting from the second logic circuit to the first logic circuit by performing the steps of:
  i) transmitting in parallel a second value from the second logic circuit to the second register;
  ii) latching the second value from the second register into the first register in response to a capture signal from the first logic circuit; and
  iii) serially transmitting the second value in the first register to the first logic circuit.

24. A method for requesting a micro-controller to transition from a normal operating mode to an interrogation mode, comprising the steps of:

serially transmitting a first value representing a transition request from an emulator to a first register, the micro-controller and the first register disposed within a same integrated circuit, the emulator located external to the integrated circuit, the first register coupled in parallel to a second register within the integrated circuit;

transmitting an update signal from the emulator to the first register to latch the first value in the first register;

generating a synchronized update signal from the update signal using a clock signal from the micro-controller;

transmitting the synchronized update signal from the synchronizer to a selector for providing a selected value from one of the first and second registers;

transmitting a write signal from the micro-controller to the selector;

providing the selected value as an output of the selector in accordance with the synchronized update signal and the write signal;

transmitting the output of the selector in parallel to the second register and the micro-controller;

transmitting a second value representing a transition acknowledgment from the micro-controller to the second register to store the second value in the second register;

latching the second value from the second register into the first register in response to a capture signal from the emulator; and serially transmitting the second value from the first register to the emulator.

* * * * *

UNITED STATES PATENT AND TRADEMARK OFFICE
CERTIFICATE OF CORRECTION

PATENT NO. : 5,515,530
DATED : May 7, 1996
INVENTOR(S) : Nick G. Eskandari It is certified that error appears in the above-identified patent and that said Letters Patent is hereby corrected as shown below:

In column 3 at line 46 delete "interface/with" and insert --interface with--

In column 5 at line 31 delete "macro-instructions "RISM commands")" and insert --macro-instructions ("RISM commands")--

Signed and Sealed this

Eighth Day of April, 1997

*Attest:*

BRUCE LEHMAN

*Attesting Officer*  Commissioner of Patents and Trademarks